United States Patent
Coene et al.

(10) Patent No.: US 7,660,224 B2
(45) Date of Patent: Feb. 9, 2010

(54) DC-CONTROLLED ENCODING FOR OPTICAL STORAGE SYSTEM

(75) Inventors: Willem Marie Julia Marcel Coene, Eindhoven (NL); Bin Yin, Eindhoven (NL)

(73) Assignee: Koninklijke Philips Electronics N.V., Eindhoven (NL)

( * ) Notice: Subject to any disclaimer, the term of this patent is extended or adjusted under 35 U.S.C. 154(b) by 210 days.

(21) Appl. No.: 10/599,836

(22) PCT Filed: Apr. 8, 2005

(86) PCT No.: PCT/IB2005/051158

§ 371 (c)(1),
(2), (4) Date: Oct. 11, 2006

(87) PCT Pub. No.: WO2005/101404

PCT Pub. Date: Oct. 27, 2005

(65) Prior Publication Data

US 2007/0205933 A1    Sep. 6, 2007

(30) Foreign Application Priority Data

Apr. 15, 2004    (EP) .................................. 04101543

(51) Int. Cl.
    *G11B 7/00*    (2006.01)
(52) U.S. Cl. ............... 369/59.17; 369/59.21; 369/59.22
(58) Field of Classification Search ............... 369/59.21
See application file for complete search history.

(56) References Cited

U.S. PATENT DOCUMENTS

| 5,974,088 | A  | * | 10/1999 | Chang ........................ 375/244 |
| 6,031,173 | A  | * | 2/2000  | Ikeda et al. ................... 84/605 |
| 6,356,215 | B1 |   | 3/2002  | Coene |
| 7,310,370 | B2 | * | 12/2007 | Faroudja .................. 375/240.1 |
| 2004/0088637 | A1 | * | 5/2004 | Wada ......................... 714/768 |
| 2006/0133252 | A1 | * | 6/2006 | Rapp ....................... 369/59.22 |

FOREIGN PATENT DOCUMENTS

WO    02103696 A2    12/2002

OTHER PUBLICATIONS

Haralampos Pozidis, et al: Modeling and Compensation of Asymmetry in Optical Recording, IEEE vol. 50, No. 12, Dec. 2002, pp. 2052-2063.

* cited by examiner

*Primary Examiner*—Wayne R Young
*Assistant Examiner*—Lixi Chow (57) ABSTRACT

A loss of performance of slicer adaptation at high capacities due to the mismatch between the exact bits used in the computation of the RDS for the DC-control on the one hand and the often erroneous threshold decisions that are preliminarily made based on the HF waveform on the other hand, is resolved by performing a new method of DC-control at the encoder: the RDS is modified such that it is not based on the exact channel bits, but on the threshold decisions from a synthetic HF signal waveform that is generated based on a nominal MTF (modulation transfer function) or its IRF (impulse response function) of the channel. In this way, the impact of the erroneous threshold decisions in the receiver are already taken into account at the encoder, and the slicer control is no longer negatively affected thereby.

10 Claims, 12 Drawing Sheets

DC-CONTROLLED ENCODING FOR OPTICAL STORAGE SYSTEM

This invention relates to a method and apparatus for creating a substantially DC-controllable code representative of a modulated signal received via a channel, in which a running digital sum is computed using a plurality of bits or bit-estimates. The invention also relates to an encoder incorporating such a method or apparatus, and an optical data storage system including such an encoder and a receiver.

Optical data storage systems provide a means for storing great quantities of data on a disc. As is well known in the art, an optical disc comprises at least one track which is capable of containing data written therein. The disc may be embodied so as to be a read-only disc: the disc is manufactured with data recorded in the track, and this data can only be read from the disc. However, recordable and (re-)writeable optical discs, allowing a user to record data on a disc, are also known; in this case, a disc will normally be manufactured as a blank disc, i.e. a disc having a track structure but without data recorded in the track. Similarly, disc drives may be designed as read-only devices, i.e. devices only capable of reading information from a recorded disc. However, disc drives may also be designed for writing information into the track of a recordable disc.

Physically, the information bearing portion of an optical disc is a series of pits, or bumps, arranged to form a spiral track. Data is encoded in the length of the individual pit-marks (or pits) and of the spaces (also known as land-marks) between pits. A laser beam reflected from the optical disc is modulated by the pits and spaces, and received by a detector which produces a similarly modulated electrical signal, or track data signal.

The track data signal is demodulated to recover digital information stored on the disc by observing the amplitude of the track data signal responsive to a data clock. The characteristics of the track data signals enable the data clock to be derived from the track data signal using phase locked loop (PLL) circuitry. Data is encoded such that if the amplitude of the track data signal is approximately the same from one sample to the next, the corresponding bit has a value of '0', and a value of '1' otherwise.

Figure 1:
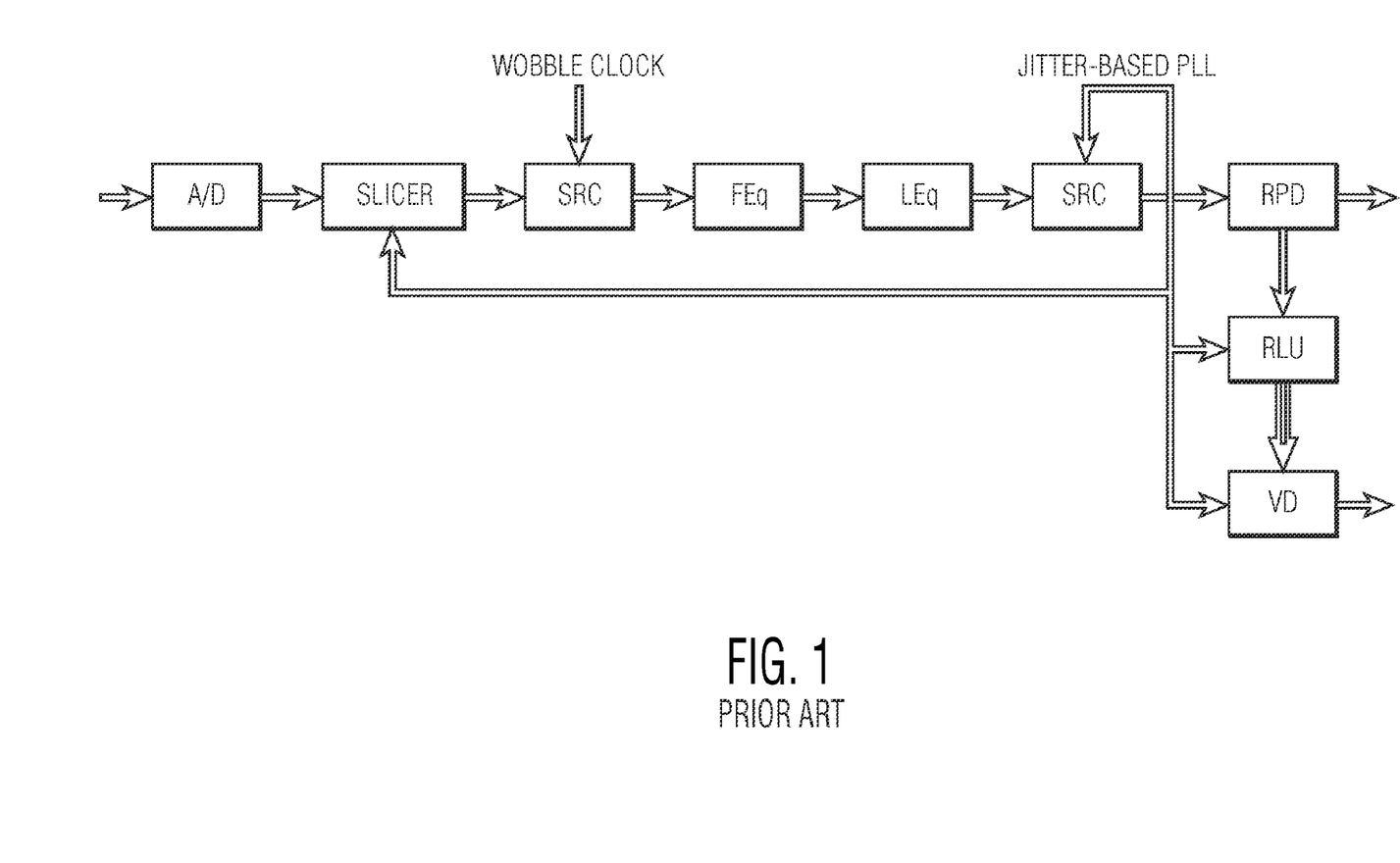
FIG. 1 is a schematic block diagram of a "classical" receiver (already with advanced signal processing) for a BD 23-25-27 GB optical storage system.

Referring to FIG. 1 of the drawings, a receiver with advanced signal processing and bit-detection for an optical storage system is illustrated schematically. The light of the laser beam that is reflected and diffracted by the pit-structures on the disc, is captured by a photo-detector, which generates an electrical signal, often called RF or HF signal. An A/D converter generates digital samples of the (electrical) signal waveform. Those samples are corrected for a DC-offset by a slicer. The origin of the DC-offset can be due to fingerprints and other (low-frequent) disturbances on the disc. The sliced HF samples enter a first sample-rate converter, that has clock information derived from a wobble signal (as is available for a recordable/rewritable disc). Subsequently, the HF-signal samples are equalized (by a linear equalizer, and possibly followed by a non-linear equalizer known as Limit-Equalizer), after which the samples enter a jitter-based PLL with a second sample-rate converter. These output samples are bit-synchronous and are used for a runlength-pushback bit-detector (which is used as a preliminary bit-detector), the output of which is coupled to an adaptive look-up table of reference levels (RLU), that are used in the Viterbi bit-detector (VD). Moreover, the bit-synchronous HF-samples are further used to drive the slicer-module that corrects for the DC-offset in the signal.

Thus, during readout, the laser beam from each spot is diffracted by the 2D pattern on the disc, which is received as high-frequency (HF) signal waveforms. HF represents the intensity of light detected within the central aperture in the exit pupil plane of the objective lens. As the density of recorded information increases, the physical proximity of one recorded bit to the next adjacent bit tends to cause interference between adjacent bits, and the HF value is influenced by this Inter-Symbol-Interference (ISI). The ISI increases with increasing bit-density along the track-direction.

It is well known to encode the digital data so that only specified sequences of transitions of the medium are permitted. These permitted sequences are known to reduce the effects of inter-symbol interference. Furthermore, these constraint sequences are characterized by a minimum mark-size (or pit-size) that is larger than in the unencoded case; therefore, for a write-channel that is limited by the smallest mark that can be written, the use of such a code generating these constraint sequences is also advantageous. In particular, it is common to use run-length-limited (RLL) encoding of the digital data to generate an RLL-encoded stream of bits to be read by read channel digital processing means. This encoded stream of bits is often referred to as channel bits in that they represent the stream of bits encountered by read channel components of the device. In any event, an RLL (d,k) code is generally used to encode an arbitrary set of data bits into a stream of channel bits such that the encoded channel bits satisfy the "d" and "k" constraints, and a wide variety of encodings that satisfy a given (d,k) constraint may be used. Several such encodings are well known in the field of optical data storage.

Figure 2:
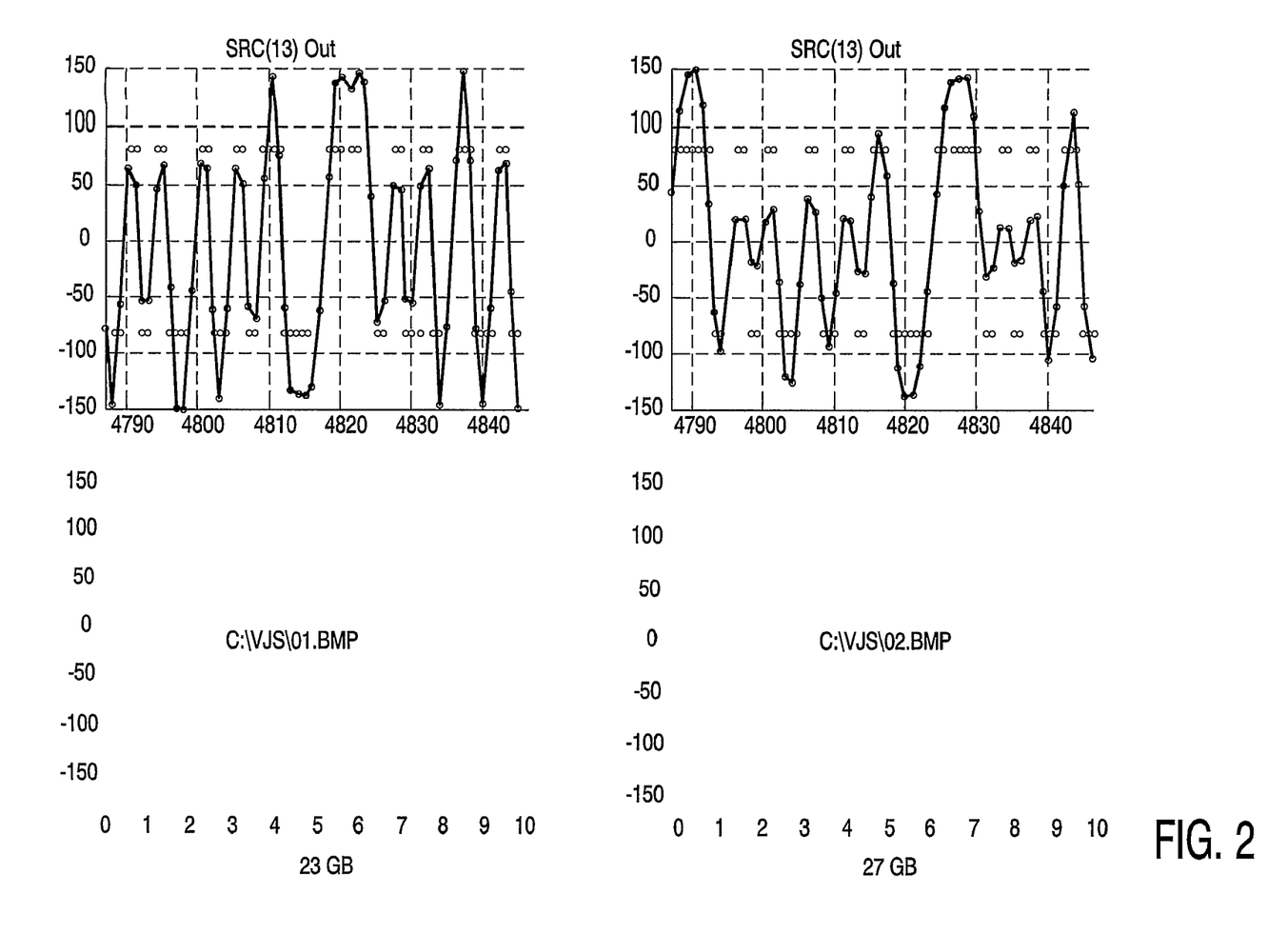
FIG. 2 is a graphical representation illustrating changes in HF signal waveform and eye-pattern going from BD 23 GB to BD 27 GB.
Figure 3:
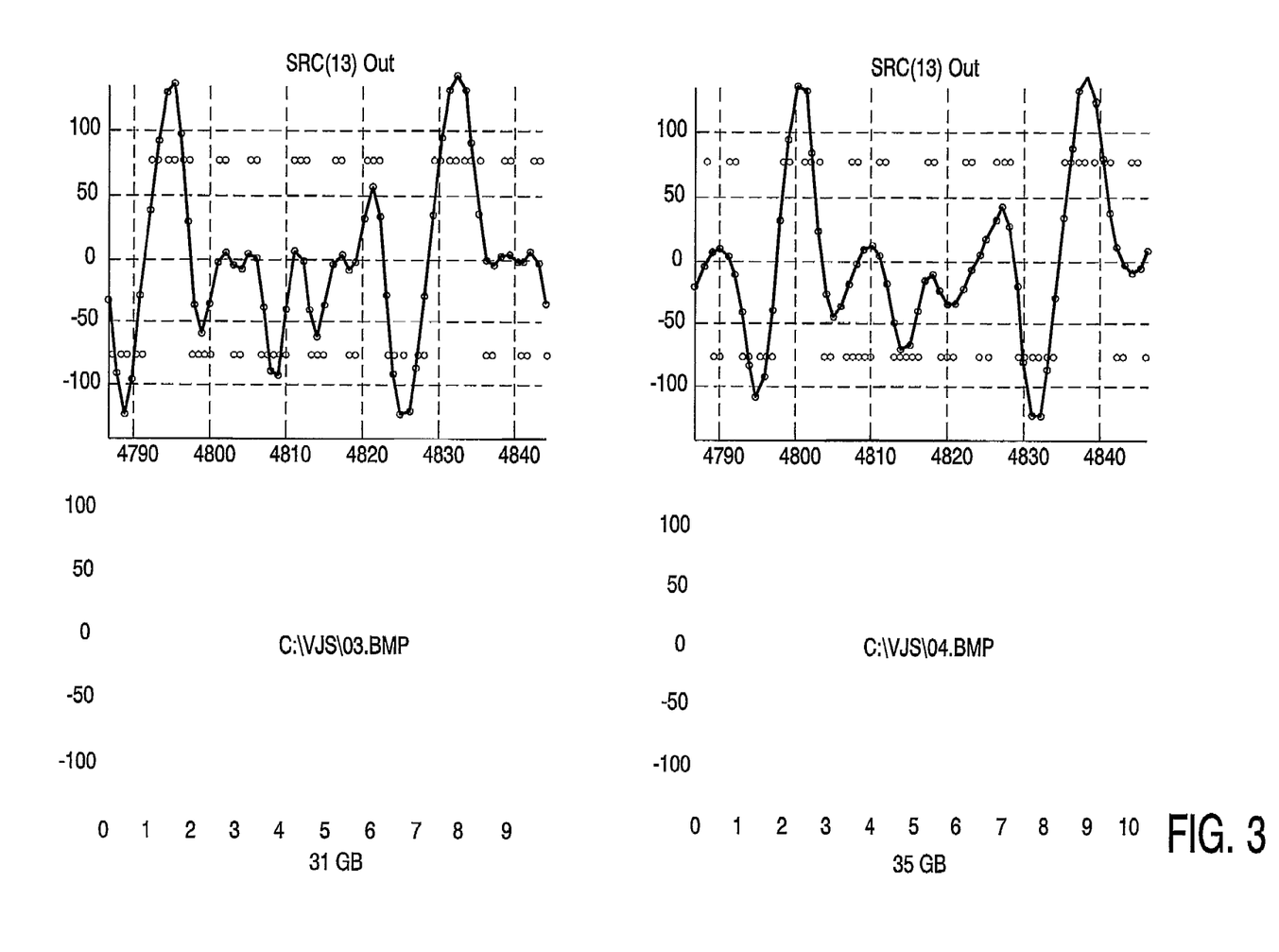
FIG. 3 is a graphical representation illustrating changes in HF signal waveform and eye-pattern going from BD 31 GB to BD 35 GB.

The linear density of the bits and the track pitch are fixed by the specification of the particular optical disc format. For example, CD discs employ a track pitch of 1.6 µm having approximately 80 thousand channel bits per linear inch, while DVD employs a track pitch only about one-half as wide (0.74, µm) and having approximately 200 thousand channel bits per linear inch. In high capacity optical storage systems, beyond the Blu-ray Disc (BD) capacity of 23-25-27 GB, many aspects of the (already) advanced receiver illustrated schematically in, and described with reference to, FIG. 1 cannot be used in their existing form. In particular, at capacities beyond 31 GB, there are very significant changes in the characteristics of the signal waveform. For example, assuming a track pitch always equal to 320 nm, the tangential bit length for 31 GB becomes T=60.5 nm, so that the highest frequency in the system (with d=1 coding), which is equal to ¼T (which equals 4.13: m$^{-1}$), becomes very close to the cut-off frequency of the channel, given by:

$$\Omega_c = 2NA/\lambda \quad (1)$$

which equals 4.20: m$^{-1}$ for Blu-ray Disc (BD) parameters. The gradual degradation of the HF signal waveform and the eye pattern going from BD 23 GB, over BD 27 GB and BD 31 GB, up to BD 35 GB can be seen in FIGS. 2 and 3 of the drawings.

Figure 4:
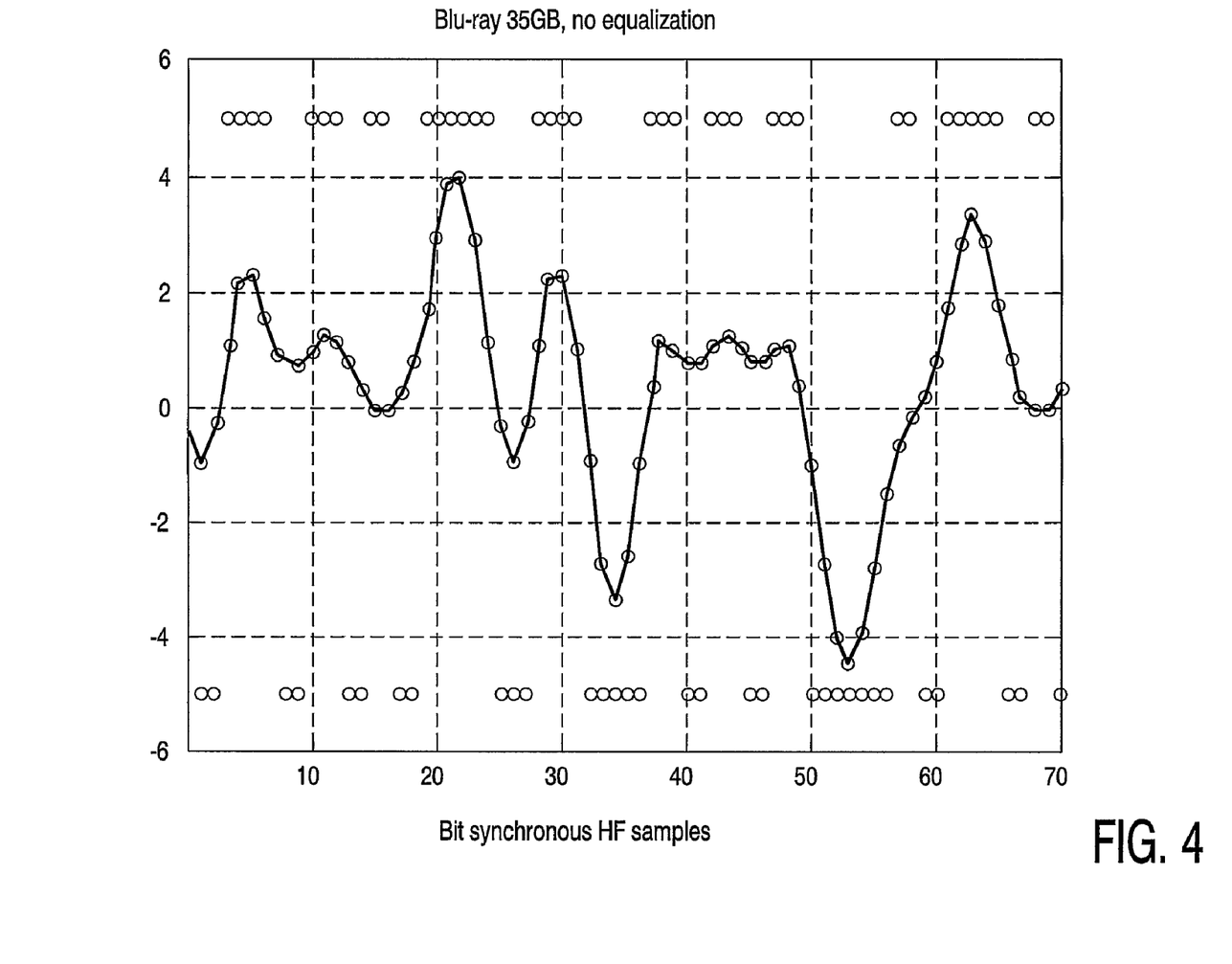
FIG. 4 is a graphical representation illustrating typically problematic HF signal waveforms for 35 GB BD, e.g. 2T|2T runs starting at bit position 15, and a 3T|2T|3T|2T|3T pattern starting at bit position 37.
Figure 5:
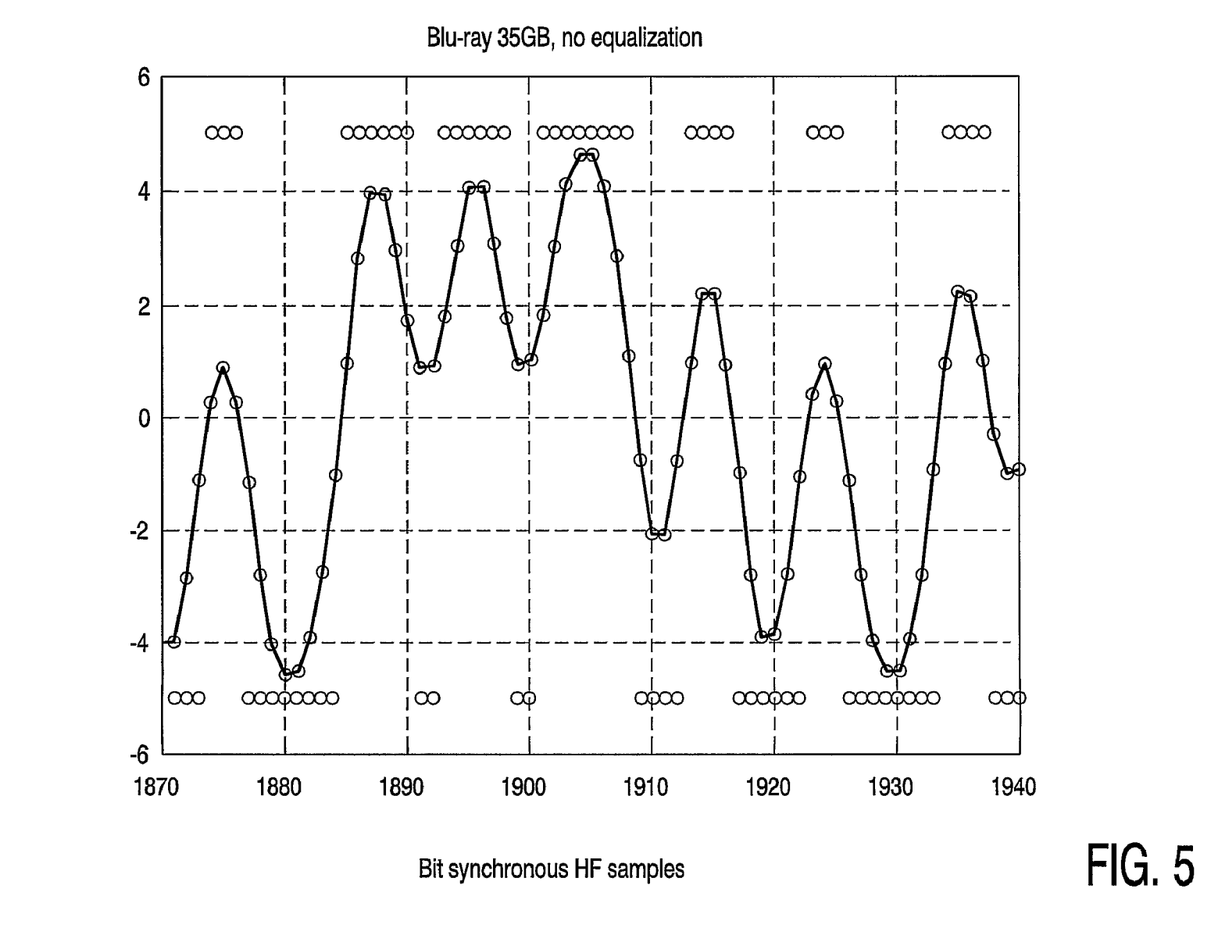
FIG. 5 is a graphical representation illustrating typically problematic HF signal waveforms for 35 GB BD, e.g. 2T runs between longer runs (at bit positions 1891 and 1899.

At these high densities beyond BD 31 GB, the 2T-runs are not well, or even not at all, transferred by the optical channel. Typical effects can be seen in FIGS. 4 and 5 of the drawings. FIG. 4 illustrates (around bit 40) 2T runs (of pit-type) alternating with 3T runs (of land-type), with as a result, a waveform of low amplitude, but with the signal always above the slicer level, so that the 2T runs are "lost" for a simple threshold detector. FIG. 5 illustrates 2T runs in the vicinity of long runs of opposite polarity (opposite to that of the 2T run): in the HF signal, these 2T runs may disappear to a large extent, and result in only a small indentation of the waveform that could be interpreted by a simple threshold detector as a much longer run (of the same polarity).

Although for bit-detection for the BD-system, use is made of the more advanced Viterbi detection (also known as PRML detection, standing for partial-response maximum-likelihood), for the control of the DC-offset (or slicer-level) in the "slicer" module of FIG. 1, a simple threshold detection is still being used.

Thus, at higher capacities (say, for BD>27 GB), where the highest frequencies in the system are around or beyond the cut-off frequency of the channel's modulation transfer function (MTF), which characterises the model of an optical channel, leading to very poor or even no transfer of the high frequency information, simple threshold decisions on the HF signal waveform result in many decision errors, which increase the standard deviation of the slicer level updates, which necessitates the reduction of the bandwidth of the slicer-control, and consequently prohibits the slicer control for being as fast as it is for less aggressive capacities (where threshold bit-decisions are of much better quality). It is an object of the present invention, therefore, to provide an encoder for a receiver for an optical data storage system, and a receiver and optical data storage system including such an encoder, arranged to overcome the above-mentioned problems that are typical of a high-capacity optical storage system, and enable the slicer control to be performed at a faster rate relative to prior art arrangements that use simple threshold bit-decisions on the signal waveform.

Thus, in accordance with the present invention, there is provided apparatus for creating a substantially DC-controllable channel bitstream based upon a channel code, representative of a modulated signal received via a channel, the apparatus comprising means for receiving data representative of a nominal modulation transfer function or impulse response function of said channel, means for generating a synthetic high frequency signal waveform using said nominal modulation transfer function or impulse response function, means for performing threshold detection in respect of said synthetic high frequency signal waveform to produce intermediate channel bits, and means for computing a running digital sum using said intermediate channel bits.

Also in accordance with the present invention, there is provided a method of creating a substantially DC-controllable channel bitstream based upon a channel code, representative of a modulated signal received via a channel, the method comprising receiving data representative of a nominal modulation transfer function or impulse response function of said channel, generating a synthetic high frequency signal waveform using said nominal modulation transfer function ir impulse response function, performing threshold detection in respect of said synthetic high frequency signal waveform to produce intermediate channel bits, and computing a running digital sum using said intermediate channel bits.

It will be appreciated that the running digital sum on said intermediate channel bits can be used to steer decisions for DC-control to be taken at certain DC-control points in the bitstream (either in the user bitstream or the channel bitstream, depending on the method used to control the running digital sum).

The present invention further extends to an encoder including the apparatus defined above, and to an optical data storage system including such an encoder and a receiver having slicer apparatus for performing threshold detection in respect of a high frequency signal waveform derived from a modulated signal to create a digital signal representative thereof. It will be appreciated that the digital signal represents the as-detected intermediate channel bitstream, which can then be used for the adaption of the DC-offset or slicer-level in the slicer-module.

In a preferred embodiment of the invention, the code representative of the modulated signal is a run length limited (RLL) code and, as such, the apparatus preferably includes means for performing RLL encoding in respect of a plurality of user bits received via said channel, preferably prior to computation of the running digital sum.

Means are beneficially provided for updating a threshold value in respect of the slicer apparatus in response to changes in said high frequency signal waveform derived from said modulated signal and threshold decisions based on said received moduled signal.

These and other aspects of the present invention will be apparent from, and elucidated with reference to, the embodiment described herein.

An embodiment of the present invention will now be described by way of example only, and with reference to the accompanying drawings, in which.

Due to the analogue nature of the waveform sensed by a receiver in an optical data storage system, and due to the inter-symbol interference problems noted above, it has previously been a problem to sense and decode the encoded user data bits and, as explained above, the problem is particularly exacerbated as storage density increases. In order to partially resolve such problems, it is known to use sequence detectors to sense particularly expected sequences of pulses rather than attempting to detect each discrete individual pulse in the sampled waveform (without using the waveform samples at the neighbouring bits). In particular, a Viterbi sequence detector (VD) is commonly used to read channels used in optical storage media, so as to sense most likely sequences of encoded channel bits.

The control loop of the slicer level in a receiver (see FIG. 1 of the drawings) is required to follow relatively slow variations in the central aperture HF signal due to fingerprints, drop-outs, etc. Slicer control can be performed faster if, instead of making use of bit-decisions resulting from a Viterbi bit detector, (preliminary) threshold decisions are performed on a sample-by-sample basis. Slicer control, in this case of using threshold decisions, requires that the channel bitstream is DC-free, i.e. that the running-digital-sum (RDS) has a limited variance, and this DC-free property is generally realised at the side of the Modulation-Code Encoder, traditionally on the channel bitstream, as will be familiar to a person skilled in the art. Thus, slicer adaptation is performed, in accordance with the prior art, using the DC-controlled property of the channel bitstream. A schematic diagram of the "classical" receiver for BD 23-25-27 GB can be seen in FIG. 1 (but it should be noted that it has already advanced signal processing measures, like a Viterbi detector (VD)), and it will be appreciated by a person skilled in the art that the "slicer" operates on raw samples of the HF signal waveform that is unequalised and asynchronous (thus, it need not necessarily be synchronous).

Consider first traditional DC-control (based on the known parity-preserve principle, or on the principle of merging-bits, or on the principle of combi-codes) which aims to minimize the variance $\sigma_{RDS}^2$ of the running digital sum, denoted RDS. Which is defined as (with $b_i$ the bipolar channel bits (also known as NRZI-bits) with values ±1):

$$RDS_i = \sum_{j=-\infty}^{i} b_j \quad (2)$$

Figure 6:
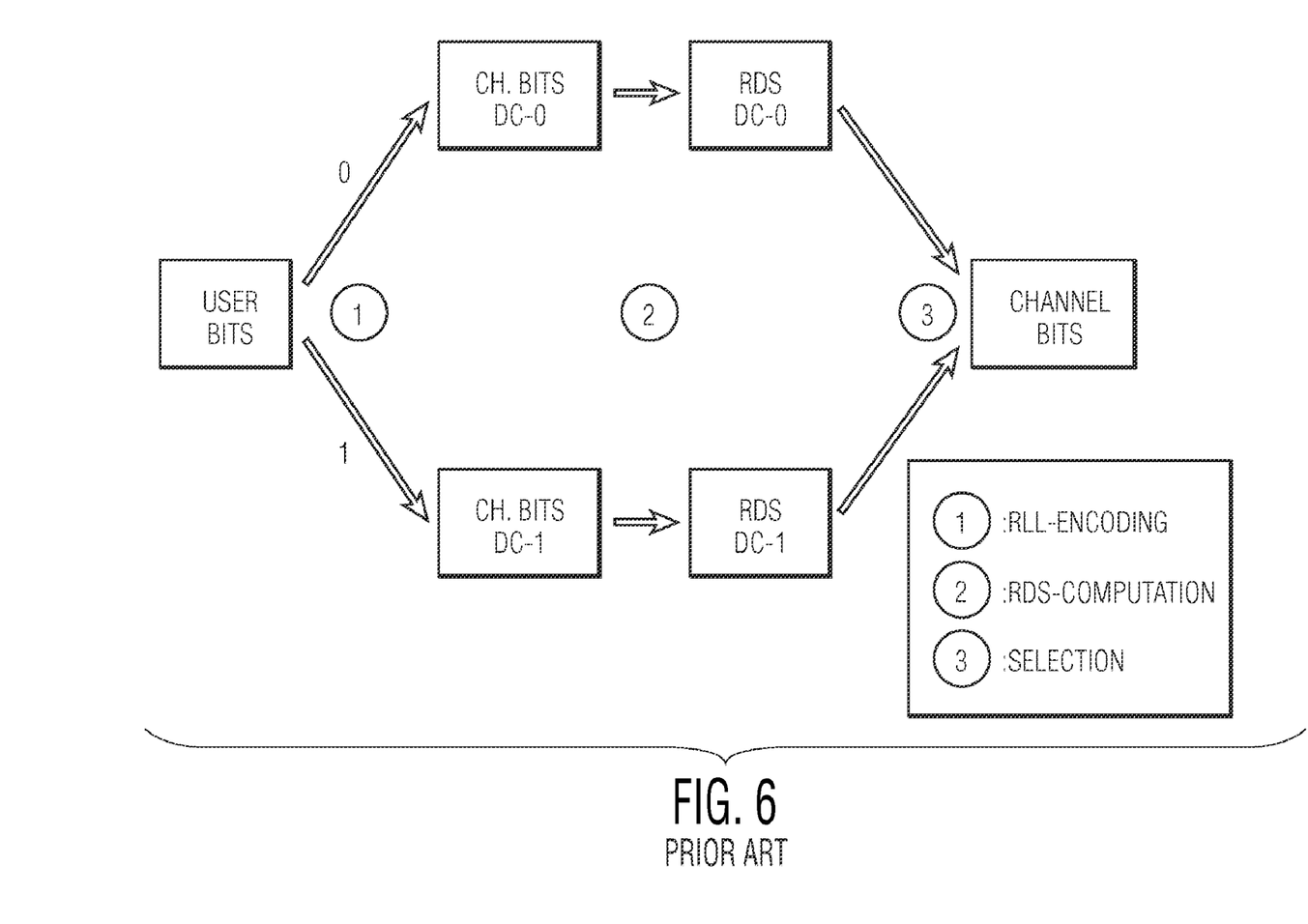
FIG. 6 is a schematic flow diagram illustrating DC-control encoding for a segment of a user bitstream according to a prior art approach.

The state-of-the-art DC-control is shown in FIG. 6. The DC control decision points divide the bitstream in consecutive segments. For a given segment, the channel bitstream is encoded by means of the RLL encoder in step (1) for both choices of DC-control (for instance in the case of the parity-preserve method parity-bit equal to "1" or "0", or, in the case of merging bits in the channel bitstream, merging bits (for d=1) equal to "00" or "10" (or "01") for both polarity choices). For both choices, the RDS is computed in step (2), together with its variance over the segment under consideration. Finally, the DC-control choice with the lowest variance of the RDS (or, alternatively, the DC-control choice with the lowest RDS-value in absolute value, at the end of the segment is selected in step (3).

The state-of-the-art "slicer control", that is the control of the slicer level (denoted SL) at the receiver side, is implemented according to (with $HF_k$ being the k-th sample of the (asynchronously or synchronously sampled) high-frequency signal waveform):

$$SL_{k+1} = SL_k + \epsilon \text{Sign}(HF_k - SL_k) \quad (3)$$

Figure 7:
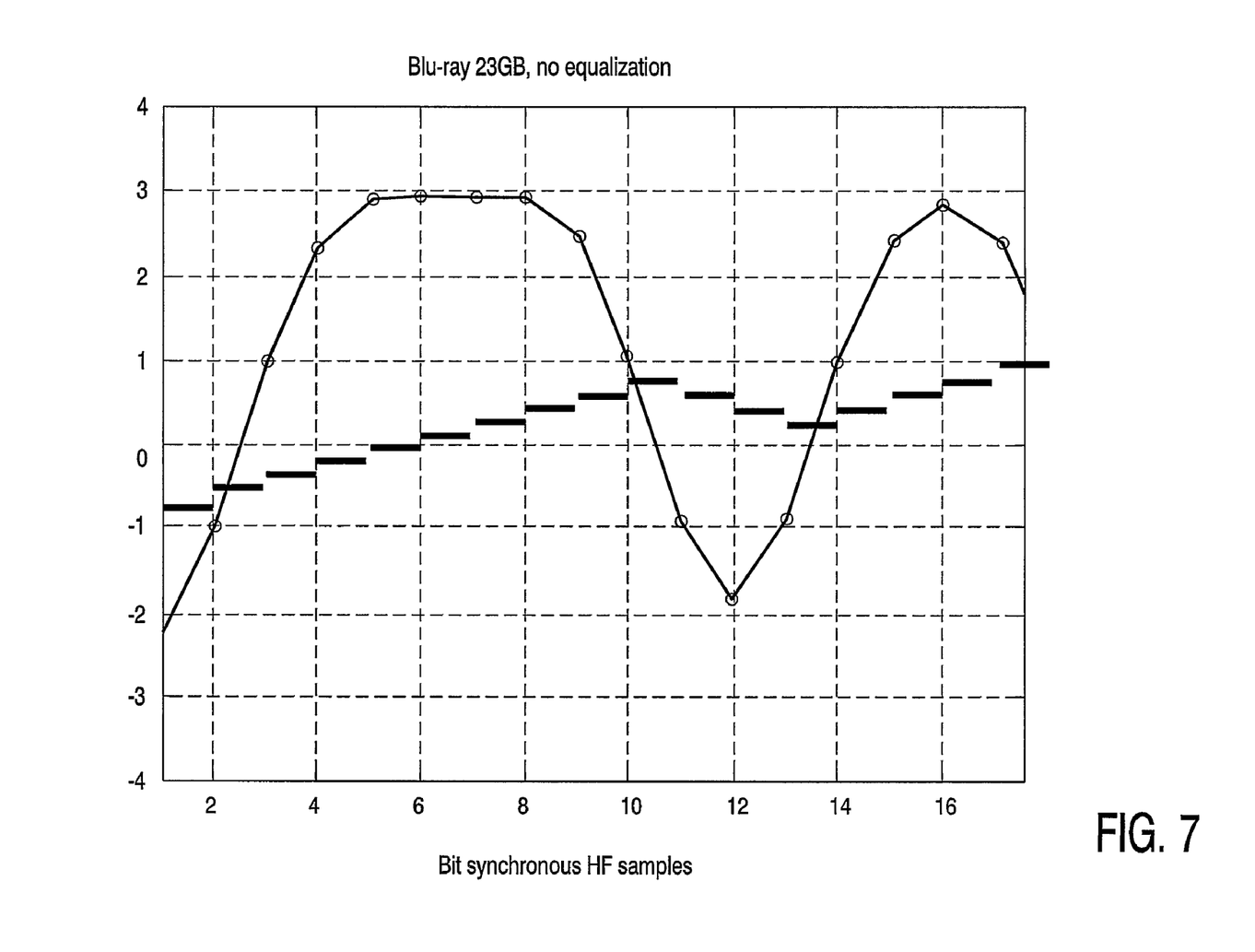
FIG. 7 is a graphical representation of the principle of slicer adaptation based on threshold decisions from HF signal waveform (note that the step size is significantly exaggerated)

At the signal transitions, the above equation can be refined so that it accounts for phase-offsets relative to the centre point between two sampling points (for simplicity, we have omitted this refinement). The parameter $\epsilon$ determines the update speed of the slicer-level control (a smaller value of $\epsilon$ corresponds with a slower update rate, and thus a smaller bandwidth in the adaptation). FIG. 7 shows the principle of SL-control for a large value of $\epsilon$ (this value has been made unrealistically large just for display purposes in the figure; practical values of $\epsilon$ lie in the range $10^{-3}$ to $10^{-5}$). The result of the SL-control is that the slicer level equals the median of the HF signal waveform: the number of HF samples above the slicer level is equal to the number of samples below the slicer level (within a window of a minimum number of samples, that is determined via the update rate $\epsilon$).

The underlying assumption of the SL-control in Eq. (3) is that simple threshold detection yields a very good bER-performance (for a synchronous HF signal waveform, the Sign operation in Eq. (3) is nothing else than threshold detection). Note that the decision of the threshold detector yields only a real bit-decision in the case of the synchronous signal waveform (since there is no one-to-one correspondence between the asynchronous samples and the channel bits).

The assumption that threshold detection yields a good bER is only valid for capacities below 25 GB (for a 12 cm disc using a BD optical pick-up unit, OPU); for increasingly higher capacities, this assumption becomes more and more unreliable, and therefore its lack of validity will affect the performance of the slicer-level control in a negative sense. Because of the erroneous decisions made by the threshold detection at high capacities, the SL-control in the receiver does just the opposite action of what it was supposed to do by the DC-control at the encoder side.

The key of the problem is the mismatch of the exact bits used for DC-control in Eq. (2) and the decision errors by the slicing operation (Sign) as used in the SL-control of Eq. (3).

A logical solution would be to use better bit-decisions for the SL-control: those better bit-decisions must then come from a Viterbi-like bit-detector which performs sequence detection using the multi-valued character of the signal waveform for a controlled ISI. However, a first disadvantage of this solution is that those bit-decisions are produced by the Viterbi detector with a non-negligible delay (e.g. due to the trace-back operation of the Viterbi) which amounts to, for example, 5 times the extent in bits of the channel's impulse response function. A second disadvantage is that the HF samples at the inut of the Viterbi detector suffer from DC-offsets (as they are due to fingerprints etc) which may lead to a worse performance of the bit-detector.

The solution offered by the present invention eliminates the DC-offsets by an adapted version of the traditional slicer. Thus it is necessary to eliminate the mismatch between the decisions in the slicer adaption and the exact bits as they are used in the DC-control. This mismatch becomes more significant with increasing capacity.

The solution offered by this exemplary embodiment of the present invention is to perform DC-control at the encoder, hereby controlling the running-digital-sum, not based on the exact bits, but based on threshold decisions from a synthetic HF signal waveform (denoted $HF_{syn}$) that is obtained from a nominal MTF (modulation transfer function) or its IRF (impulse response function; denoted $h_k$). The nominal IRF must be matched to the capacity for which the storage application is meant for (e.g. by the cut-off frequency $\Omega_c$ of the Braat-Hopkins MTF in optical recording).

For the simple case of a linear channel, the synthetic HF signal waveform is simply obtained by the convolution sum (with $b_k$ the bipolar channel bits):

$$HF_{syn,k} = \Sigma_m h_m b_{k-m}. \quad (4)$$

The case of channel non-linearities (e.g. with pit-land asymmetry) will be dealt with in a later section. Based on this synthetic waveform, we introduce a modified RDS parameter (denoted $$\tilde{RDS}) \text{ by: } \tilde{RDS}_i = \sum_{j=-\infty}^{i} \text{Sign}(HF_{syn,j}) \quad (5)$$

DC-control can then be performed by minimization of the variance $\sigma_{\tilde{RDS}}^{2}$. By doing so, the DC-control at the encoder anticipates on (most of) the bit-errors that will be made by a simple threshold detector in the SL-control module in the receiver, thus removing the mismatch referred to above.

Figure 8:
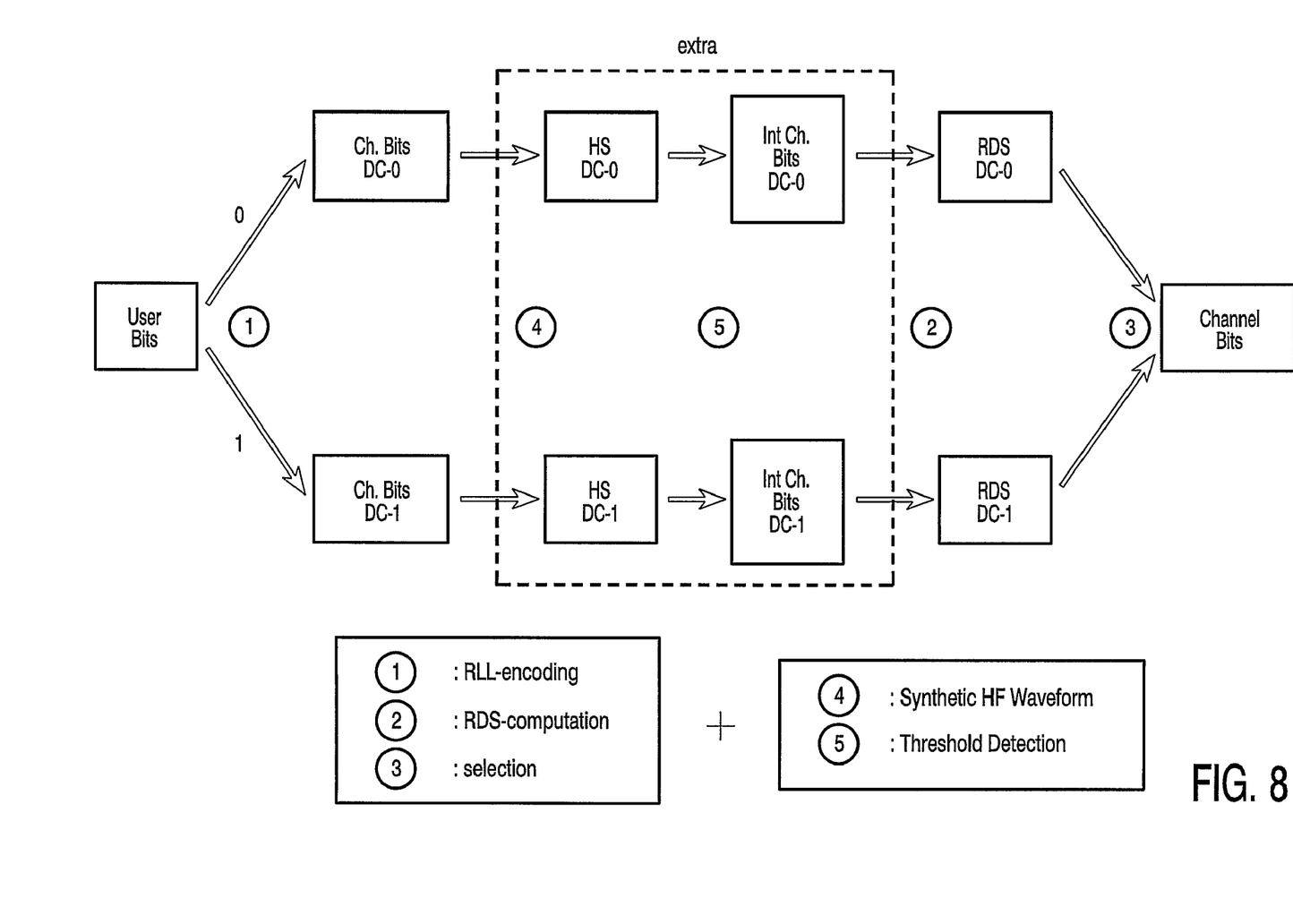
FIG. 8 is a schematic flow diagram illustrating DC-control encoding for a segment of a user bitstream according to an exemplary embodiment of the present invention (Note: "Int. Ch. Bits" stands for Intermediate channel bits)

The DC-control according to this exemplary embodiment is shown in FIG. 8. There are two additional steps: step (4) comprises the computation of the synthetic HF signal waveform, and step (5) in which the threshold detection on the synthetic waveform is applied, which yields the intermediate channel bits, which replace the exact bits in the state-of-the-art approach of FIG. 6.

Note that the encoder requires knowledge of the nominal MTF of the channel (which depends on the targeted density on the disc).

Figure 9:
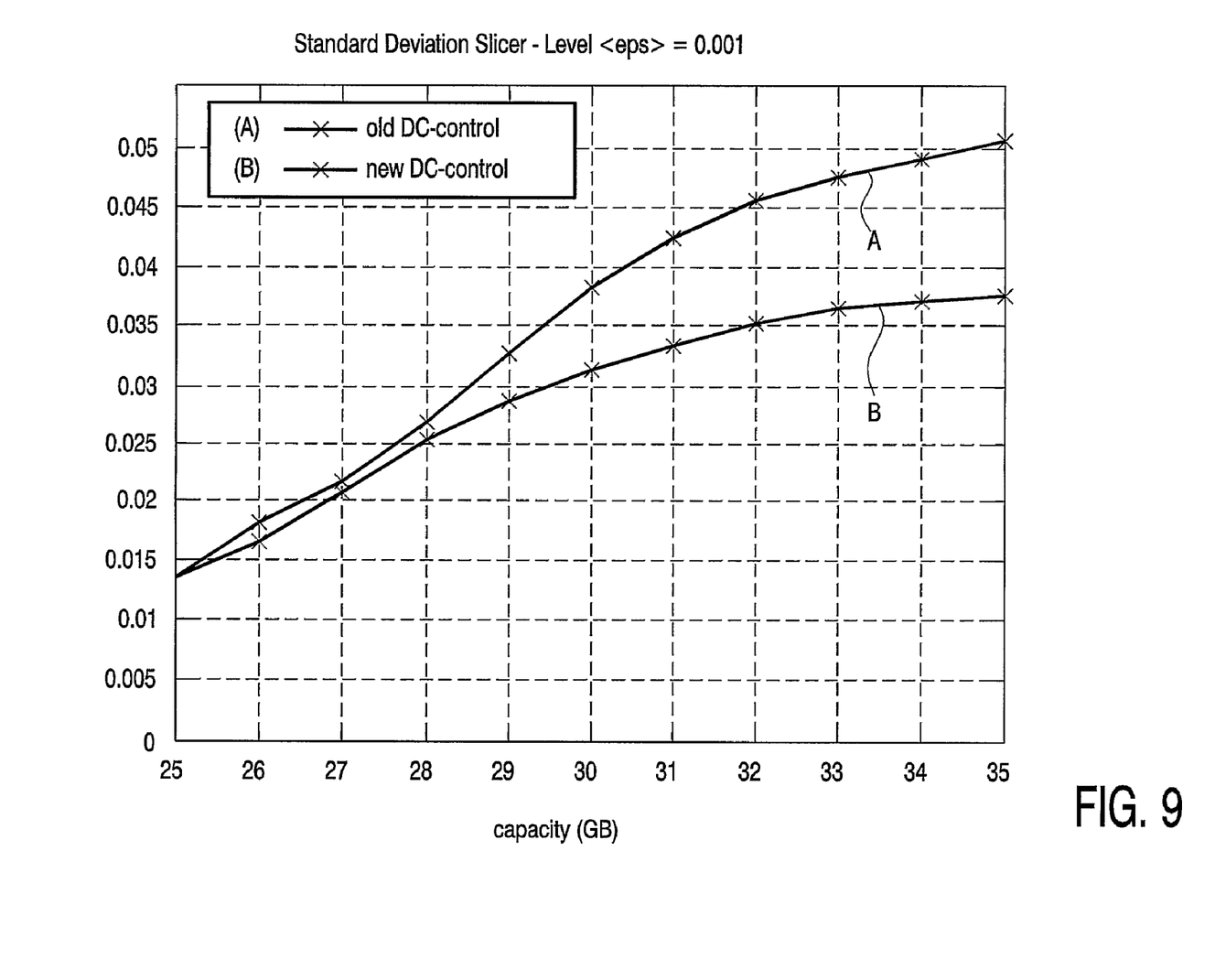
FIG. 9 is a graphical illustration of the standard deviation of the slicer-level scaled to standard deviation of signal $\sigma_{SL}/\sigma_{signal}$ for BD 35 GB and $\epsilon\epsilon$=0.001.
Figure 10:
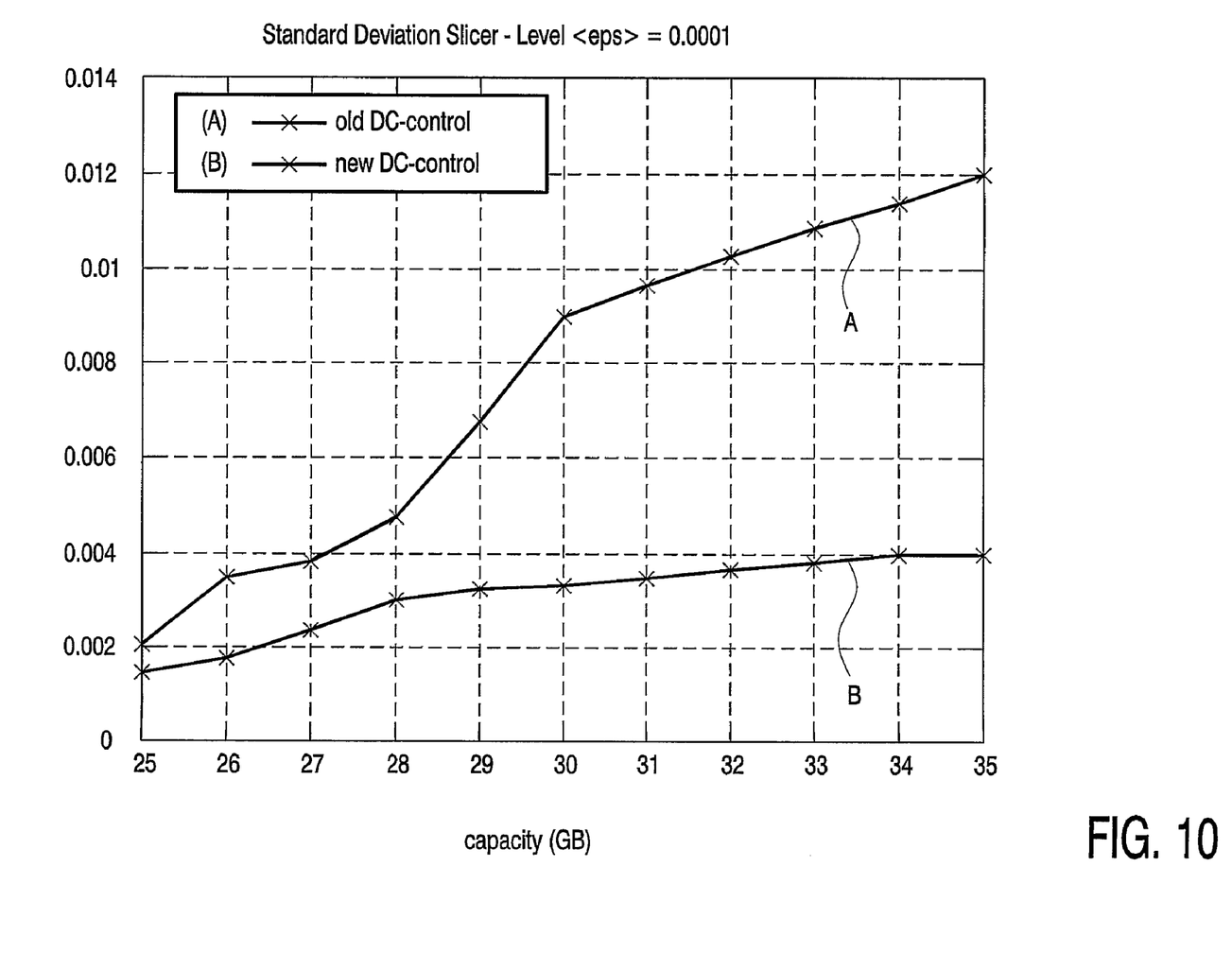
FIG. 10 is a graphical illustration of the standard deviation of the slicer-level scaled to standard deviation of signal $\sigma_{SL}/\sigma_{signal}$, for BD 35 GB and $\epsilon$=0.0001.
Figure 11:
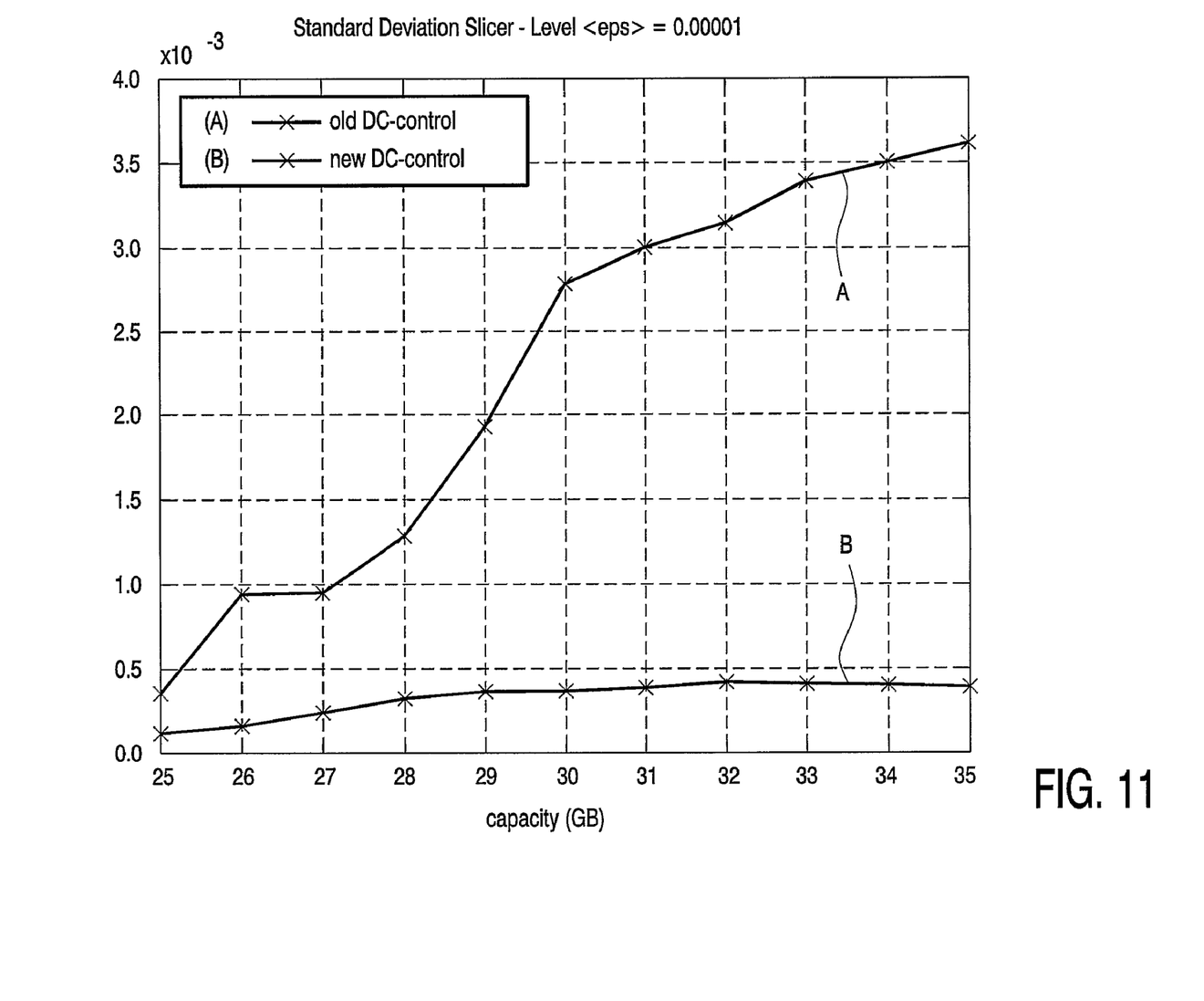
FIG. 11 is a graphical illustration of the standard deviation of the slicer-level scaled to standard deviation of signal $\sigma_{SL}/\sigma_{signal}$, for BD 35 GB and $\epsilon$=0.00001.

Thus HF signal waveforms have been simulated for the Braat-Hopkins model. In the above example d=1, k=7 Jacobi code has been used with two merging bits for DC-control (because of the simplicity of this RLL encoder). A DC-control segment of the channel bitstream comprises 66 channel bits. NO DC-level variations are introduced, so we know that the DC-level should be exactly at zero. Then, the standard deviation of the slicer-level after slicer-level adaptation was computed with different values of the update-rate parameter $\epsilon$. The results for $\epsilon=0.001$, $\epsilon=0.0001$ and $\epsilon=0.00001$ are shown in FIG. 9, FIG. 10 and FIG. 11 respectively. The improvement of the new DC-control procedure, based on the modified RDS can be clearly seen: for $\epsilon=0.0001$ at BD 35 GB, the improvement is equal to a factor of three.

In the case of non-negligible pit-land asymmetry, it is not possible to rely on the HF-model of Eq. (4). Instead, the known A-parameter model can be used (see, for example, H. Poziolis, J. W. M. Bergmans, W. M. J. Coene, "*Modeling and Compensation of Asymmetry in Optical Recording*", IEEE Transactions on Communications, Vol. 50, No. 12, December 2002, pp. 2052-2063), in which an intermediate ternary bitstream, denoted $\tilde{b}_k$ is defined as:

$$\tilde{b}_k = b_k - \frac{1}{4}(|A| + Ab_k) \times (2b_k - b_{k+1} - b_{k-1}). \quad (6)$$

The adapted HF signal waveform, denoted $HF^A$, is then obtained as:

$$HF_{syn,k}^{A} = c + \Sigma_m \tilde{b}_{k-m}. \quad (7)$$

where c is a corrective DC-term such that the middle of the inner eye corresponds with level '0' (as is required if we want to "slice" at level '0' for the bit-decisions used for DC-control); it is given by:

$$c = \frac{A}{2}\sum_m h_m. \quad (8)$$

Note that the encoder must now not only know the nominal MTF, but also the pit-land asymmetry parameter A. Moreover, the encoder has to set an absolute polarity with which the channel bitstream will be written to disc, because the asymmetry does not allow an overall polarity inversion of the channel bitstream.

The actual slicer level that results from the slicer-control loop is usually the centre of the inner eye. However, it is also possible to set the slicer level to a different signal level, by applying a certain DC-offset before the Sign-operation in Eq. (5).

Figure 12:
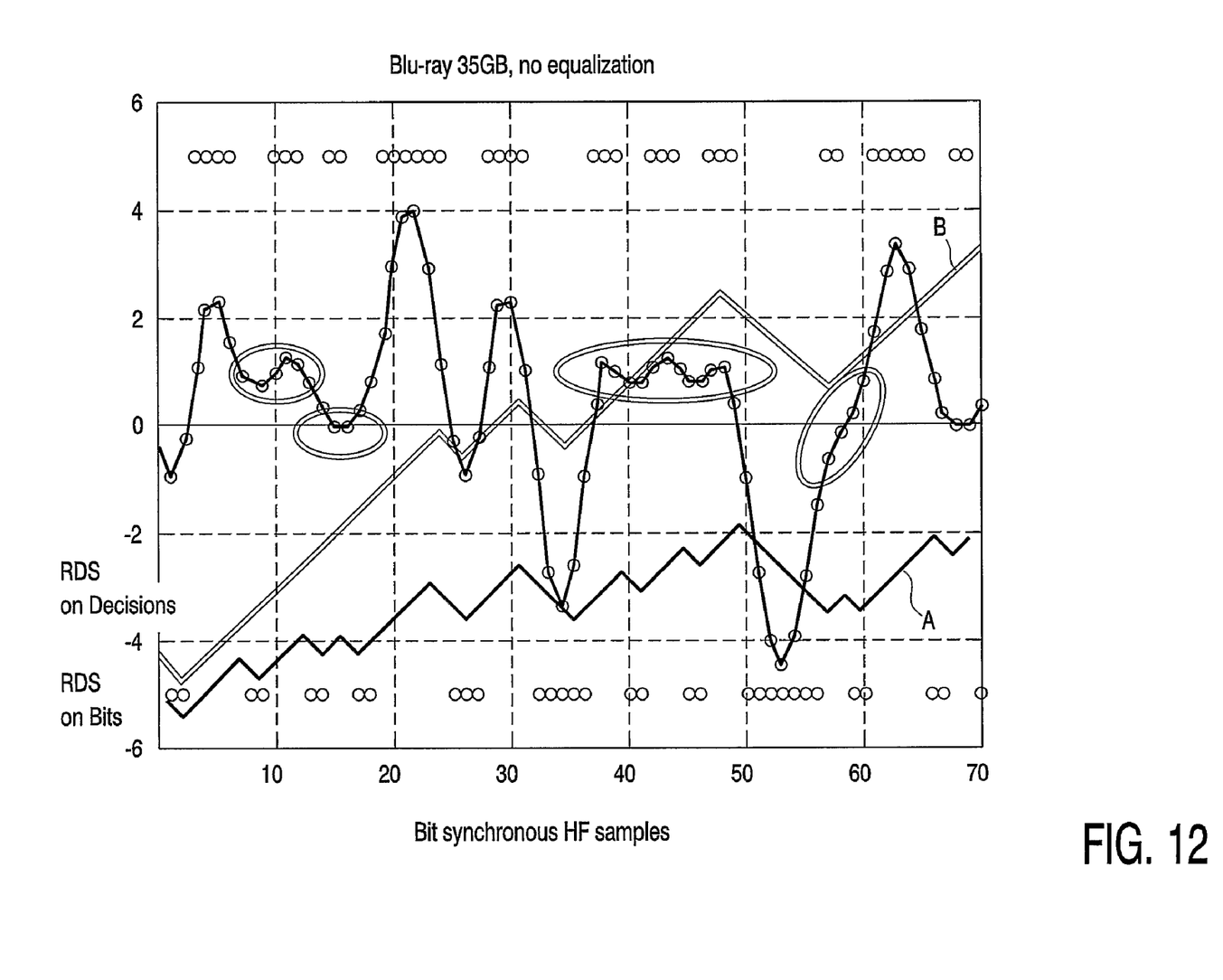
FIG. 12 is a graphical representation illustrating RDS-traces (running digital sum) superimposed on signal waveform: on exact bits (curve A) and on threshold bits (curve B)—note that the two RDS-traces diverge from each other.

Thus, in summary and as explained above, the loss of performance of the slicer adaptation at high capacities is due to the mismatch between the exact bits used in the computation of the RDS for the DC-control on the one hand (as illustrated in FIG. 12), and the often erroneous threshold decisions based on the HF waveform on the other hand. This mismatch can be resolved by the present invention by performing a new method of DC-control at the encoder: the RDS is modified such that it is not based on the exact channel bits, but on intermediate channel bits that are obtained as the threshold decisions from a synthetic HF signal waveform that is generated based on a nominal MTF (modulation transfer function) or its IRF (impulse response function) of the channel. In this way, the impact of the erroneous threshold decisions in the receiver are already taken into account at the encoder, and the slicer control is no longer negatively affected thereby. Note that, in the proposed method, the encoder needs to be informed of the nominal MTF or IRF of the channel. Extensions to channels with non-negligible pit-land symmetry are also proposed.

It should be noted that the above-mentioned embodiment illustrates rather than limits the invention, and that those skilled in the art will be capable of designing many alternative embodiments without departing from the scope of the invention as defined by the appended claims. In the claims, any reference signs placed in parentheses shall not be construed as limiting the claims. The word "comprising" and "comprises", and the like, does not exclude the presence of elements or steps other than those listed in any claim or the specification as a whole. The singular reference of an element does not exclude the plural reference of such elements and vice-versa. The invention may be implemented by means of hardware comprising several distinct elements, and by means of a suitably programmed computer. In a device claim enumerating several means, several of these means may be embodied by one and the same item of hardware. The mere fact that certain measures are recited in mutually different dependent claims does not indicate that a combination of these measures cannot be used to advantage.

The invention claimed is:

1. Apparatus for creating a substantially DC-controllable channel bit-stream based upon a channel code, representative of a modulated signal received via a channel, the apparatus comprising means for receiving data representative of a nominal modulation transfer function or impulse response function of said channel, means for generating a synthetic high frequency signal waveform using said nominal modulation transfer function or impulse response function, means for performing threshold detection in respect of said synthetic high frequency signal waveform to produce intermediate channel bits, and means for computing a running digital sum using said intermediate channel bits.

2. Apparatus according to claim 1, wherein the code representative of the modulated signal is a run length limited (RLL) code.

3. Apparatus according to claim 2, wherein the apparatus includes means for performing RLL encoding in respect of a plurality of user bits that are to be encoded.

4. Apparatus according to claim 3, wherein said RLL encoding performed prior to computation of the running digital sum.

5. An encoder including apparatus according to claim 1.

6. An optical data storage system, comprising an encoder according to claim 5, and a receiver comprising slicer apparatus for performing threshold detection in respect of a high frequency signal waveform derived from a modulated signal to create a digital signal representative thereof.

7. A system according to claim 6, the receiver further comprising slicer-control means for updating a threshold value in respect of the slicer apparatus in response to changes in said high frequency signal waveform, so as to correct for a DC-offset in said high-frequency signal waveform.

8. A system according to claim 6, the receiver further including a sequence detector for said high frequency signal waveform.

9. A system according to claim 8, wherein said sequence detector is a Viterbi sequence detector.

10. A method for creating a substantially DC-controllable channel bit-stream based upon a channel code, representative of a modulated signal received via a channel, the method comprising receiving data representative of a nominal modulation transfer function or impulse response function of said channel, generating a synthetic high frequency signal waveform using said nominal modulation transfer function or impulse response function, performing threshold detection in respect of said synthetic high frequency signal waveform to produce intermediate channel bits, and computing a running digital sum using said intermediate channel bits.

\* \* \* \* \*